(12) United States Patent
Ichimura et al.

(10) Patent No.: US 10,418,239 B2
(45) Date of Patent: Sep. 17, 2019

(54) EPITAXIAL SUBSTRATE FOR SEMICONDUCTOR ELEMENTS, SEMICONDUCTOR ELEMENT, AND MANUFACTURING METHOD FOR EPITAXIAL SUBSTRATES FOR SEMICONDUCTOR ELEMENTS

(71) Applicant: NGK INSULATORS, LTD., Nagoya-shi, Aichi (JP)

(72) Inventors: Mikiya Ichimura, Ichinomiya (JP); Sota Maehara, Nagoya (JP); Yoshitaka Kuraoka, Okazaki (JP)

(73) Assignee: NGK INSULATORS, LTD., Nagoya-shi, Aichi (JP)

( * ) Notice: Subject to any disclaimer, the term of this patent is extended or adjusted under 35 U.S.C. 154(b) by 0 days.

(21) Appl. No.: 15/965,065

(22) Filed: Apr. 27, 2018

(65) Prior Publication Data
US 2018/0247810 A1   Aug. 30, 2018

Related U.S. Application Data

(63) Continuation of application No. PCT/JP2016/082370, filed on Nov. 1, 2016.
(Continued)

(30) Foreign Application Priority Data

Jan. 14, 2016 (JP) .................................. 2016-005164
Oct. 5, 2016 (WO) .................. PCT/JP2016/079619

(51) Int. Cl.
*H01L 21/02* (2006.01)
*C23C 16/34* (2006.01)
(Continued)

(52) U.S. Cl.
CPC ...... *H01L 21/02389* (2013.01); *C23C 16/303* (2013.01); *C23C 16/34* (2013.01);
(Continued)

(58) Field of Classification Search
None
See application file for complete search history.

(56) References Cited

U.S. PATENT DOCUMENTS 8,030,682 B2 * 10/2011 Fujikura ........... H01L 21/02433
257/101
9,054,167 B2   6/2015 Saunier
(Continued)

FOREIGN PATENT DOCUMENTS

JP   2006-332367 A   12/2006
JP   2010-171416 A    8/2010
(Continued)

OTHER PUBLICATIONS

International Preliminary Report on Patentability for PCT/JP2016/082370, dated May 8, 2018 (1 page).
(Continued)

*Primary Examiner* — Michelle Mandala
(74) *Attorney, Agent, or Firm* — Flynn Thiel, P.C.

(57) ABSTRACT

Provided is an epitaxial substrate for semiconductor elements which suppresses an occurrence of current collapse. The epitaxial substrate for the semiconductor elements includes: a semi-insulating free-standing substrate formed of GaN being doped with Zn; a buffer layer being adjacent to the free-standing substrate; a channel layer being adjacent to the buffer layer; and a barrier layer being provided on an opposite side of the buffer layer with the channel layer therebetween, wherein the buffer layer is a diffusion sup-
(Continued)

pressing layer formed of Al-doped GaN and suppresses diffusion of Zn from the free-standing substrate into the channel layer.

8 Claims, 3 Drawing Sheets

Related U.S. Application Data (60) Provisional application No. 62/249,565, filed on Nov. 2, 2015.

(51) Int. Cl.

| | | |
|---|---|---|
| H01L 29/778 | (2006.01) | |
| H01L 29/20 | (2006.01) | |
| H01L 29/201 | (2006.01) | |
| H01L 21/205 | (2006.01) | |
| H01L 29/40 | (2006.01) | |
| H01L 29/66 | (2006.01) | |
| H01L 29/812 | (2006.01) | |
| C30B 19/02 | (2006.01) | |
| C30B 29/40 | (2006.01) | |
| H01L 29/205 | (2006.01) | |
| C23C 16/30 | (2006.01) | |
| H01L 29/207 | (2006.01) | |

(52) U.S. Cl.
CPC ............ *C30B 19/02* (2013.01); *C30B 29/406* (2013.01); *H01L 21/0251* (2013.01); *H01L 21/0254* (2013.01); *H01L 21/0262* (2013.01); *H01L 21/02458* (2013.01); *H01L 21/205* (2013.01); *H01L 29/201* (2013.01); *H01L 29/2003* (2013.01); *H01L 29/205* (2013.01); *H01L 29/401* (2013.01); *H01L 29/66007* (2013.01); *H01L 29/66462* (2013.01); *H01L 29/778* (2013.01); *H01L 29/7786* (2013.01); *H01L 29/7787* (2013.01); *H01L 29/812* (2013.01); *H01L 29/207* (2013.01)

(56) References Cited

U.S. PATENT DOCUMENTS

| | | |
|---|---|---|
| 2009/0189190 A1 | 7/2009 | Hashimoto et al. |
| 2010/0230723 A1 | 9/2010 | Hashimoto et al. |
| 2013/0075786 A1 | 3/2013 | Ishiguro |
| 2013/0105817 A1 | 5/2013 | Saunier |
| 2015/0311290 A1* | 10/2015 | Kang ............... H01L 21/02378 257/77 |

FOREIGN PATENT DOCUMENTS

| | | |
|---|---|---|
| JP | 2011-068548 A | 4/2011 |
| JP | 2011-187643 A | 9/2011 |
| JP | 2013/074211 A | 4/2013 |
| JP | 2013-118360 A | 6/2013 |
| JP | 2014-027187 A | 2/2014 |

OTHER PUBLICATIONS

English translation of Written Opinion of the International Searching Authority for PCT/JP2016/082370, dated Jan. 24, 2017 (4 pages).

International Preliminary Report on Patentability for PCT/JP2016/079619, dated May 8, 2018 (1 page).

English translation of Written Opinion of the International Searching Authority for PCT/JP2016/079619, dated Dec. 27, 2016 (5 pages).

International Preliminary Report on Patentability for PCT/JP2016/082367, dated May 8, 2018 (1 page).

English translation of Written Opinion of the International Searching Authority for PCT/JP2016/082367, dated Jan. 24, 2017 (4 pages).

International Search Reports for PCT/JP2016/079619, PCT/JP2016/082370 and PCT/JP2016/082367 (4 pgs).

*AlGaN/GaN Heterostructure Field-Effect Transistors on Fe-Doped GaN Substrates with High Breakdown Voltage,* by Y. Oshimura et al, Japanese Journal of Applied Physics, vol. 50, 2011, pp. 084102-1 through 084102-5 (5 pgs).

*Comparison of the DC and Microwave Performance of AlGaN/GaN HEMTs Grown on SiC by MOCVD with Fe-Doped or Unintentionally Doped GaN Buffer Layers,* by V. Desmaris et al, IEEE Transactions on Electron Devices, vol. 53, No. 9, 2006, pp. 2413-2417 (5 pgs).

*Inhibition of interface pollution in AlGaN/GaN HEMT structures regrown on semi-insulating GaN templates,* by M. Azize et al, Elsevier, Journal of Crystal Growth, vol. 299, 2007, pp. 103-108 (6 pgs).

*Optical activation and diffusivity of ion-implanted Zn acceptors in GaN under high-pressure, high-temperature annealing,* by T. Suski et al, Journal of Applied Physics, vol. 84, No. 2, 1998, pp. 1155-1157 (3 pgs).

\* cited by examiner

EPITAXIAL SUBSTRATE FOR SEMICONDUCTOR ELEMENTS, SEMICONDUCTOR ELEMENT, AND MANUFACTURING METHOD FOR EPITAXIAL SUBSTRATES FOR SEMICONDUCTOR ELEMENTS

CROSS-REFERENCE TO RELATED APPLICATIONS

This is a continuation of International Application No. PCT/JP2016/082370, filed Nov. 1, 2016, which claims the benefit of U.S. Provisional Application No. 62/249,565, filed Nov. 2, 2015, Japanese Application No. 2016-005164, filed Jan. 14, 2016 and PCT/JP2016/079619, filed Oct. 5, 2016, all of which are hereby incorporated by reference herein in their entirety.

TECHNICAL FIELD

The present invention relates to a semiconductor element, and particularly to a semiconductor element constituted by using a free-standing substrate that is made of semi-insulating GaN.

BACKGROUND ART

Nitride semiconductors, which have a direct-transition-type wide band gap, high breakdown electric field, and high saturation electron velocity, have been used as light emission devices such as LED or LD and semiconductor materials for high-frequency/high-power electronic devices.

Typical structures of the nitride electronic devices include a high electron mobility transistor (HEMT) structure which is formed by laminating AlGaN as "a barrier layer" and GaN as "a channel layer". This structure utilizes a feature that a high concentration two-dimensional electron gas is generated at an AlGaN/GaN lamination interface owing to large polarization effects (spontaneous polarization effect and piezo polarization effect) inherent in nitride materials.

The nitride electronic devices are generally manufactured using different material base substrates such as sapphire, SiC, and Si which are easily available in a commercial way. However, there arises a problem that large numbers of defects occur in a GaN film which is heteroepitaxially grown on the different material substrates due to a difference of lattice constant and heat expansion coefficient between GaN and the different material substrates.

In the meanwhile, when the GaN film is homoepitaxially grown on a GaN substrate, the defect caused by the difference of lattice constant and heat expansion coefficient described above does not occur, but the GaN film shows a favorable crystalline nature.

Accordingly, when the nitride HEMT structure is manufactured on the GaN substrate, the mobility of the two-dimensional electron gas at the AlGaN/GaN lamination interface is enhanced, thus a characteristic improvement of an HEMT element (semiconductor element) manufactured using the above structure can be expected.

However, the GaN substrate manufactured by a hydride vapor phase epitaxial growth method (HVPE method), which can be commercially available, generally has an n-type conductivity due to an oxygen impurity incorporated into a crystal. The conductive GaN substrate serves as a leakage current pathway between source-drain electrodes when the HEMT element is driven at high voltages. Thus, it is preferable to use the semi-insulating GaN substrate to manufacture the HEMT element.

It is known to be efficient to perform doping of an element such as a transition metal element (Fe, for example) or group 2 element (Mg, for example) which forms a deep acceptor level in the GaN crystal to achieve the semi-insulating GaN substrate.

It is already known that when zinc (Zn) is adopted from a group 2 element, a high-quality semi-insulating GaN single-crystal substrate can be achieved (for example, refer to Patent Document 1). An investigation has been already performed on diffusion of the Zn element in the GaN crystal, and the diffusion occurs in a high temperature atmosphere and the ease of diffusion depends on the crystallinity of the GaN crystal (for example, refer to Non-Patent Document 4.) Also known is an aspect that a high-resistance layer doped with iron (Fe), which is a transition metal element, is formed on a substrate, and an intermediate layer having a high effect of incorporating Fe is further formed between the high-resistance layer and an electron transit layer, thereby preventing Fe being incorporated into the electron transit layer (for example, refer to Patent Document 2).

The manufacture of the HEMT structure on the semi-insulating GaN substrate or a substrate with the semi-insulating GaN film to evaluate each characteristic has been already performed (for example, refer to Non-Patent Document 1 to Non-Patent Document 3).

When the GaN film is epitaxially grown on the semi-insulating GaN single crystal substrate, which is doped with the transition metal element or the group 2 element, to form an epitaxial substrate for the semiconductor elements, there arises a problem that an acceptor element such as Fe, Mg, and Zn is diffused in the GaN film and acts as an electron trap in the film, thus a current collapse phenomenon occurs (for example, refer to Patent Document 3). Patent Document 3 discloses that the acceptor element, such as Fe and Mg, which is easily diffused causes current collapse.

PRIOR ART DOCUMENTS

Patent Documents

Patent Document 1: Japanese Patent No. 5039813
Patent Document 2: Japanese Patent Application Laid-Open No. 2013-74211
Patent Document 3: Japanese Patent Application Laid-Open No. 2010-171416

Non-Patent Documents

Non-Patent Document 1: Yoshinori Oshimura, Takayuki Sugiyama, Kenichiro Takeda, Motoaki Iwaya, Tetsuya Takeuchi, Satoshi Kamiyama, Isamu Akasaki, and Hiroshi Amano, "AlGaN/GaN Heterostructure Field-Effect Transistors on Fe-Doped GaN Substrates with High Breakdown Voltage", Japanese Journal of Applied Physics, vol. 50 (2011), p. 084102-1-p. 084102-5.
Non-Patent Document 2: V. Desmaris, M. Rudzinski, N. Rorsman, P. R. Hageman, P. K. Larsen, H. Zirath, T. C. Rodle, and H. F. F. Jos, "Comparison of the DC and Microwave Performance of AlGaN/GaN HEMTs Grown on SiC by MOCVD With Fe-Doped or Unintentionally Doped GaN Buffer Layers", IEEE Transactions on Electron Devices, Vol. 53, No. 9, pp. 2413-2417, September 2006.
Non-Patent Document 3: M. Azize, Z. Bougrioua, and P. Gibart, "Inhibition of interface pollution in AlGaN/GaN HEMT structures regrown on semi-insulating GaN templates", Journal of Crystal Growth, vol. 299 (2007), p. 103-p. 108.

Non-Patent Document 4: T. Suzuki, J. Jun, M. Leszczynski, H. Teisseyre, S. Strite, A. Rockett, A. Pelzmann, M. Camp, and K. J. Ebeling, "Optical activation and diffusivity of ion-implanted Zn acceptors in GaN under high-pressure, high-temperature annealing", Journal of Applied Physics, Vol. 84 (1998), No. 2, pp. 1155-1157.

SUMMARY

The present invention relates to a semiconductor element, and particularly to a semiconductor element constituted by using a free-standing substrate that is made of semi-insulating GaN.

According to the present invention, an epitaxial substrate for semiconductor elements includes: a semi-insulating free-standing substrate whose dislocation density is equal to or lower than $5.0\times10^7$ cm$^{-2}$, formed of GaN being doped with Zn; a buffer layer being adjacent to the free-standing substrate; a channel layer being adjacent to the buffer layer; and a barrier layer being provided on an opposite side of the buffer layer with the channel layer therebetween, wherein the buffer layer is a diffusion suppressing layer formed of Al-doped GaN having a thickness of 20 nm to 200 nm and Al concentration of $5\times10^{18}$ cm$^{-3}$ to $1\times10^{21}$ cm$^{-3}$ and suppresses the diffusion of Zn from the free-standing substrate into the channel layer, and the concentration of Zn in said channel layer is equal to or lower than $1\times10^{16}$ cm$^{-3}$.

According to another aspect of the present invention, a semiconductor element includes: a semi-insulating free-standing substrate whose dislocation density is equal to or lower than $5.0\times10^7$ cm$^{-2}$, formed of GaN doped with Zn; a buffer layer being adjacent to the free-standing substrate; a channel layer being adjacent to the buffer layer; a barrier layer being provided on an opposite side of the buffer layer with the channel layer therebetween; and a gate electrode, a source electrode, and a drain electrode being provided on the barrier layer, wherein the buffer layer is a diffusion suppressing layer formed of Al-doped GaN having a thickness of 20 nm to 200 nm and Al concentration of $5\times10^{18}$ cm$^{-3}$ to $1\times10^{21}$ cm$^{-3}$ and suppresses the diffusion of Zn from the free-standing substrate into the channel layer, and a concentration of Zn in said channel layer is equal to or lower than $1\times10^{16}$ cm$^{-3}$.

According to still another aspect of the present invention, a method of manufacturing an epitaxial substrate for semiconductor elements includes: a) a preparation step of preparing a semi-insulating free-standing substrate having a dislocation density equal to or lower than $5.0\times10^7$ cm$^{-2}$ and formed of GaN doped with Zn; b) a buffer layer formation step of forming a buffer layer to be adjacent to the free-standing substrate; c) a channel layer formation step of forming a channel layer to be adjacent to the buffer layer; and d) a barrier layer formation step of forming a barrier layer in a position opposite to the buffer layer with the channel layer therebetween, wherein in the buffer layer formation step, the buffer layer is formed as a diffusion suppressing layer formed of Al-doped GaN, which has a thickness of 20 nm to 200 nm and Al concentration of $5\times10^{18}$ cm$^{-3}$ to $1\times10^{21}$ cm$^{-3}$, and suppresses the diffusion of Zn from the free-standing substrate into the channel layer, so that the concentration of Zn is equal to or lower than $1\times10^{16}$ cm$^{-3}$.

According to the present invention, a semiconductor element in which the current collapse is reduced while using a semi-insulating GaN free-standing substrate can be achieved.

Thus, it is an object of the present invention to provide an epitaxial substrate for semiconductor elements which suppresses the occurrence of current collapse.

DESCRIPTION OF EMBODIMENT(S)

Group numbers of a periodic table in the present specification are according to the explanation of group numbers 1 to 18 in the nomenclature of inorganic chemistry revised in 1989 by the international union of pure applied chemistry (IUPAC). Group 13 refers to, for example, aluminum (Al), gallium (Ga), and indium (In), group 14 refers to, for example, silicon (Si), germanium (Ge), tin (Sn), and lead (Pb), and group 15 refers to, for example, nitrogen (N), phosphorous (P), arsenic (As), and antimony (Sb).

<Summary of Epitaxial Substrate and HEMT Element>

Figure 1:
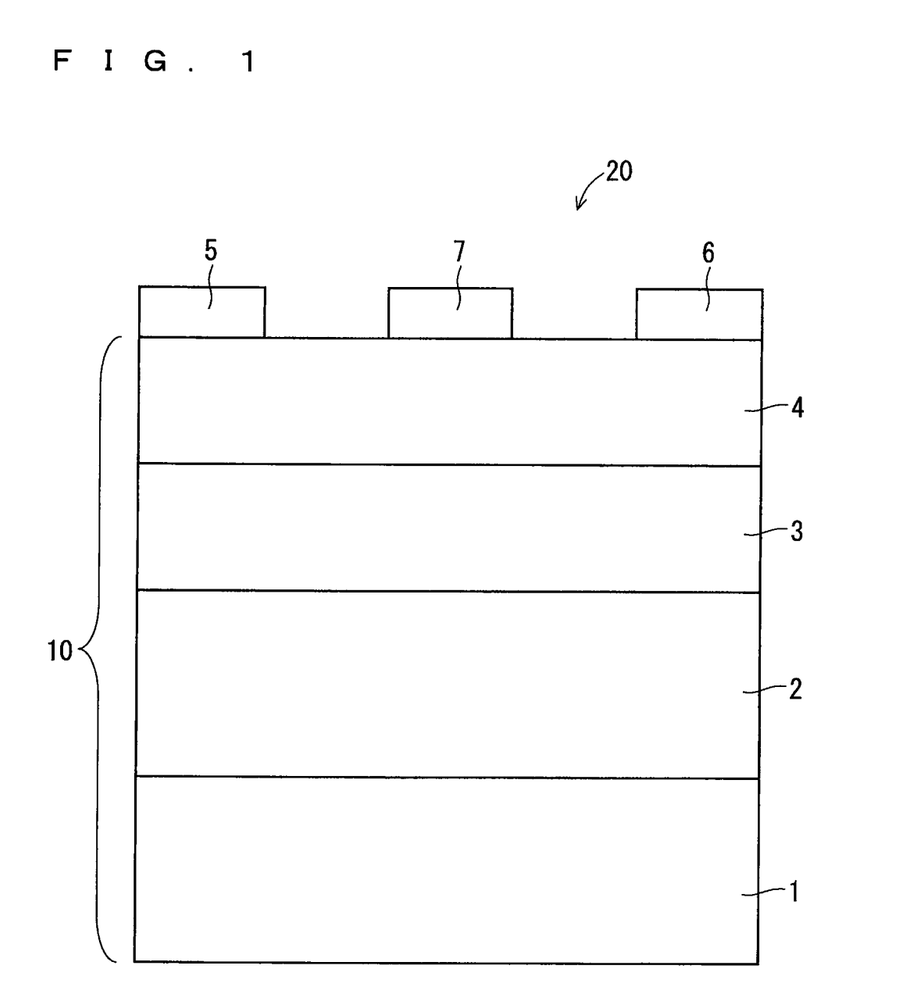
FIG. 1 is a drawing schematically illustrating a cross-sectional structure of an HEMT element 20.

FIG. 1 is a drawing schematically illustrating a cross-sectional structure of an HEMT element 20 as one embodiment of a semiconductor element according to the present invention, which includes an epitaxial substrate 10 as one embodiment of an epitaxial substrate for semiconductor elements according to the present invention.

The epitaxial substrate 10 includes a free-standing substrate 1, a buffer layer 2, a channel layer 3, and a barrier layer 4. The HEMT device 20 comprises a source electrode 5, a drain electrode 6, and a gate electrode 7 disposed on the epitaxial substrate 10 (on the barrier layer 4). The ratios of the respective layers in FIG. 1 do not reflect the actual ones.

The free-standing substrate 1 is a GaN substrate which is doped with $1\times10^{18}$ cm$^{-3}$ or more of Zn and has a (0001) plane orientation, a resistivity of $1\times10^2$ Ωcm or more at room temperature and semi-insulation properties. A dislocation density of the free-standing substrate 1 is preferably equal to or lower than $5\times10^7$ cm$^{-2}$ in terms of suppressing the diffusion of Zn into the channel layer 3. Although the size of the free-standing substrate 1 is not particularly limited, the free-standing substrate 1 preferably has a thickness of approximately several hundreds of μm to several mm in consideration of, for example, ease of handling (grasping and movement, for example). The free-standing substrate 1 can be manufactured by a flux method, for example.

The free-standing substrate 1 formed by the flux method is obtained by the following processes briefly of: immersing a seed substrate in a melt containing metal Ga, metal Na, metal Zn, and C (carbon) in a growing vessel (alumina crucible) disposed to be horizontally rotatable in a pressure vessel; keeping a predetermined temperature and a predetermined pressure in the growing vessel with the introduction of nitrogen gas, while horizontally rotating the growing vessel; and then separating a GaN single crystal, which is resultantly formed on the seed substrate from the seed substrate. A so-called template substrate in which a GaN thin film is formed on a sapphire substrate by a MOCVD method can be preferably used as the seed substrate.

The buffer layer 2 is a layer having a thickness of 10 to 1000 nm, (adjacently) formed on one main surface of the free-standing substrate 1. In the present embodiment, the buffer layer 2 is formed at a temperature substantially the same as the formation temperature of the channel layer 3 and the barrier layer 4, differing from a so-called low-temperature buffer layer formed at a low temperature lower than 800° C.

In the epitaxial substrate 10 according to the present embodiment, the buffer layer 2 is provided as a diffusion suppressing layer to suppress the diffusion of Zn, with which the free-standing substrate 1 is doped, into the channel layer 3 and further into the barrier layer 4 on the channel layer 3 at a time of manufacturing the epitaxial substrate 10. The buffer layer 2, as a preferred example, is constituted by a layer formed of GaN containing Al doped at a concentration of $1\times10^{18}$ cm$^{-3}$ to $5\times10^{21}$ cm$^{-3}$. In the above case, the diffusion of Zn from the free-standing substrate 1 into the channel layer 3 is preferably suppressed, and accordingly, current collapse is preferably suppressed in the HEMT element 20 manufactured using the epitaxial substrate 10.

The buffer layer 2 is preferably provided to have a thickness of 20 to 200 nm. The buffer layer 2 is preferably formed of GaN containing Al doped at a concentration of $5\times10^{18}$ cm$^{-3}$ to $1\times10^{21}$ cm$^{-3}$. In these cases, current collapse in the HEMT element 20 manufactured using the epitaxial substrate 10 is further suppressed.

Although it is also possible to make the thickness of the buffer layer 2 larger than 1000 nm and make the Al concentration of the buffer layer 2 higher than $5\times10^{21}$ cm$^{-3}$, a crack may occur on a surface of the epitaxial substrate 10 (a surface of the barrier layer 4) in these cases.

When the thickness of the buffer layer 2 is smaller than 10 nm and the Al concentration of the buffer layer 2 is lower than $5\times10^{17}$ cm$^{-3}$, the effect of suppressing the diffusion of Zn is not sufficiently obtained, and as a result, current collapse is not sufficiently suppressed, thus such conditions are not preferable.

The channel layer 3 is a layer (adjacently) formed on the buffer layer 2. The channel layer 3 is formed to have a thickness of approximately 50 to 5000 nm. The barrier layer 4 is a layer provided on an opposite side of the buffer layer 2 with the channel layer 3 therebetween. The barrier layer 4 is formed to have a thickness of approximately 2 to 40 nm.

The barrier layer 4 may be formed adjacent to the channel layer 3 as illustrated in FIG. 1, and in this case, an interface therebetween is a hetero junction interface. Alternatively, a spacer layer not shown may be provided between the channel layer 3 and the barrier layer 4, and in this case, a region from an interface between the channel layer 3 and the spacer layer and an interface between the barrier layer 4 and the spacer layer is a hetero junction interface region.

In any case, as a preferred example, the channel layer 3 is formed of GaN, and the barrier layer 4 is formed of AlGaN ($Al_xGa_{1-x}N$, 0<x<1) or InAlN ($In_yAl_{1-y}N$, 0<y<1). However, the combination of the channel layer 3 and the barrier layer 4 is not limited thereto.

The formation of the buffer layer 2, the channel layer 3, and the barrier layer 4 is achieved by the MOCVD method, for example. In a case where the buffer layer 2 is formed of Al-doped GaN, the channel layer 3 is formed of GaN, and the barrier layer 4 is formed of AlGaN, for example, the layer formed by the MOCVD method can be performed, using a publicly known MOCVD furnace capable of supplying an organic metal (MO) source gas for Ga and Al (TMG and TMA), ammonia gas, hydrogen gas, and nitrogen gas into a reactor, by heating the free-standing substrate 1 disposed in the reactor to a predetermined temperature, and depositing a GaN crystal and an AlGaN crystal generated by a gas phase reaction between the organic metal source gas corresponding to each layer and the ammonia gas on the free-standing substrate 1 in sequence.

The source electrode 5 and the drain electrode 6 are metal electrodes each having a thickness of approximately ten and several nm to a hundred and several tens of nm. The source electrode 5 and the drain electrode 6 are preferably formed as multi-layered electrodes of, for example, Ti/Al/Ni/Au. The source electrode 5 and the drain electrode 6 have ohmic contact with the barrier layer 4. The source electrode 5 and the drain electrode 6, as a preferred example, are formed by a vacuum evaporation method and a photolithography process. It is preferable to perform a thermal treatment for several tens of seconds in a nitrogen gas atmosphere at a predetermined temperature of 650 to 1000° C. after forming the electrodes 5 and 6 to enhance the ohmic contact of those electrodes.

The gate electrode 7 is a metal electrode having a thickness of approximately ten and several nm to a hundred and several tens of nm. The gate electrode 7 is preferably formed as a multi-layered electrode of, for example, Ni/Au. The gate electrode 7 has Schottky contact with the barrier layer 4. The gate electrode 7, as a preferred example, is formed by a vacuum evaporation method and a photolithography process.

<Method of Manufacturing Epitaxial Substrate and HEMT Element>

(Manufacture of Free-Standing Substrate)

A procedure of manufacturing the free-standing substrate 1 by the flux method is firstly described.

Firstly, a c-plane sapphire substrate having a diameter substantially the same as that of the free-standing substrate 1 to be manufactured is prepared, and a GaN low-temperature buffer layer is formed on a surface of the c-plane sapphire substrate to have a thickness of approximately 10 to 50 nm at a temperature of 450 to 750° C. Subsequently, a GaN thin film having a thickness of approximately 1 to 10 μm is formed by the MOCVD method at a temperature of 1000 to 1200° C., thereby obtaining a MOCVD-GaN template usable as a seed substrate.

Next, a Zn-doped GaN single crystal layer is formed by a Na flux method using the MOCVD-GaN template which has been obtained as the seed substrate.

Specifically, the MOCVD-GaN template is firstly disposed in an alumina crucible, and subsequently, the alumina crucible is filled with 10 to 60 g of metal Ga, 15 to 90 g of metal Na, 0.1 to 5 g of metal Zn, and 10 to 500 mg of C.

The alumina crucible is put in a heating furnace and heated for approximately 20 to 400 hours with a furnace temperature of 800 to 950° C. and a furnace pressure of 3 to 5 MPa, and subsequently cooled to room temperature. After finishing cooling, the alumina crucible is taken out of the furnace. As a result of the above procedure, a brown GaN single crystal layer with a thickness of 300 to 3000 μm is deposited on the surface of the MOCVD-GaN template.

The GaN single crystal layer which has been obtained in such a manner is ground with diamond abrasive grains to planarize a surface thereof. The Flux-GaN template having the GaN single crystal layer formed on the MOCVD-GaN template is thereby obtained. However, the grinding is performed to the extent that the total thickness of a nitride layer on the Flux-GaN template is sufficiently kept larger than a targeted thickness of the free-standing substrate 1 to be obtained eventually.

Subsequently, by a laser lift off method in which laser light is emitted from a side of the seed substrate to perform scanning at a scan speed of 0.1 to 100 mm/sec., the seed substrate is separated from the Flux-GaN template. Third harmonic of Nd: YAG having a wavelength of 355 nm, for example, is preferably used as the laser light. In the above case, the pulse width may be set to approximately 1 to 1000 ns and a pulse period may be set to approximately 1 to 200 kHz. In emitting the laser light, it is preferable to appropriately collect the laser light to adjust the light density. It is preferable to emit the laser light while heating the Flux-GaN template from a side opposite to the seed substrate at a temperature of approximately 30 to 600° C.

After separating the seed substrate, a grinding processing is performed on a surface, from which the seed substrate has been detached, of a laminated structure which has been obtained. The free-standing substrate 1 formed of GaN containing Zn doped at a concentration of $1\times10^{18}$ cm$^{-3}$ or more (Zn-doped GaN single crystal free-standing substrate) is thereby obtained.

The dislocation density of the free-standing substrate 1 can be controlled by changing the thickness of the Zn-doped GaN single crystal layer formed in the Flux-GaN template. This utilizes that as the Zn-doped GaN single crystal layer is formed thicker, a region with lower dislocation density is formed thereon. Accordingly, the free-standing substrate 1 having the dislocation density equal to or lower than $5\times10^{7}$ cm$^{-2}$ as described above can also be obtained by appropriately defining a formation thickness and a grinding amount after laser lift-off processing of the Zn-doped GaN single crystal layer.

(Manufacture of Epitaxial Substrate)

Subsequently, the manufacture of the epitaxial substrate 10 by the MOCVD method is described. The epitaxial substrate 10 is obtained by laminating the buffer layer 2, the channel layer 3, and the barrier layer 4 in this order under the following condition in a state where the free-standing substrate 1 is disposed on a susceptor provided in the reactor in the MOCVD furnace. The formation temperature means a susceptor heating temperature.

In the present embodiment, a gas ratio of group 15 to group 13 is a ratio (molar ratio) of the supply amount of ammonia, which is a group 15 (N) source, to the total supply amount of trimethylgallium (TMG), trimethylaluminum (TMA), and trimethylindium (TMI), which are group 13 (Ga, Al, and In) sources. The gas ratio of Al source gas to group 13 source gas in the case of making the barrier layer 4 of AlGaN is the ratio (molar ratio) of the supply amount of Al source sources to the supply amount of whole group 13 (Ga, Al) sources, and the gas ratio of In source gas to group 13 source gas in the case of making the barrier layer 4 of InAlN is the ratio (molar ratio) of the supply amount of In source to the supply amount of the whole group 13 (In, Al) sources. Both are defined in accordance with the composition (an Al molar ratio x or an In composition ratio y) of the desired barrier layer 4.

Buffer Layer 2:
Formation temperature=900 to 1200° C.;
Reactor pressure=5 to 30 kPa;
Carrier gas=hydrogen;
Gas ratio of group 15 to group 13=5000 to 20000; Gas ratio of Al source gas to group 13 source gas=0.00002 to 0.1.
Channel Layer 3:
Formation temperature=1000 to 1200° C.;
Reactor pressure=15 to 105 kPa;
Carrier gas=hydrogen;
Gas ratio of group 15 to group 13=1000 to 10000.
Barrier Layer 4 (in the Case of being Made of AlGaN):
Formation temperature=1000 to 1200° C.;
Reactor pressure=1 to 30 kPa;
Gas ratio of group 15 to group 13=5000 to 20000;
Carrier gas=hydrogen;
Gas ratio of Al source gas to group 13 source gas=0.1 to 0.4.
Barrier Layer 4 (in the Case of being Made of InAlN):
Formation temperature=700 to 900° C.;
Reactor pressure=1 to 30 kPa;
Gas ratio of group 15 to group 13=2000 to 20000;
Carrier gas=nitrogen;
Gas ratio of In source gas to group 13 source gas=0.1 to 0.9.

(Manufacture of HEMT Element)

The HEMT element 20 using the epitaxial substrate 10 can be manufactured by applying a publicly known technique.

For example, after an element separation processing of removing a portion of a boundary between individual elements by performing etching to approximately 50 to 1000 nm, using a photolithography process and a RIE (reactive ion etching) method, an SiO$_2$ film having a thickness of 50 to 500 nm is formed on a surface of the epitaxial substrate 10 (the surface of the barrier layer 4), and then the SiO$_2$ film at locations where the source electrode 5 and the drain electrode 6 are to be formed is removed by etching using the photolithography process, thereby obtaining an SiO$_2$ pattern layer.

Next, a metal pattern of Ti/Al/Ni/Au is formed at the locations where the source electrode 5 and the drain electrode 6 are to be formed by the vacuum deposition method and the photolithography process, thereby forming the source electrode 5 and the drain electrode 6. The metal layers preferably have thicknesses of 5 to 50 nm, 40 to 400 nm, 4 to 40 nm, and 20 to 200 nm in this order, respectively.

Subsequently, a thermal treatment is performed for 10 to 1000 seconds in a nitrogen gas atmosphere at a temperature of 600 to 1000° C. to improve the ohmic contact of the source electrode 5 and the drain electrode 6.

Then, the SiO$_2$ film at locations where the gate electrode 7 is to be formed is removed from the SiO$_2$ pattern layer using the photolithography process.

Furthermore, a Schottky metal pattern of Ni/Au is formed at the locations where the gate electrode 7 is to be formed by the vacuum deposition method and the photolithography process, thereby forming the gate electrode 7. The metal layers preferably have thicknesses of 4 to 40 nm and 20 to 200 nm, respectively.

The HEMT element 20 is obtained by the processes described above.

(Effect of Buffer Layer)

As described above, in the HEMT element 20 according to the present embodiment, the free-standing substrate 1 is formed of GaN containing Zn doped at the concentration of $1\times10^{18}$ cm$^{-3}$ or more, and the buffer layer 2 is provided to function as the diffusion suppressing layer to suppress the diffusion of Zn from the free-standing substrate 1 into the channel layer 3 at the time of manufacturing the epitaxial substrate 10. More specifically, the buffer layer 2 is the GaN layer containing Al doped at a concentration of $1\times10^{18}$ cm$^{-3}$ to $5\times10^{21}$ cm$^{-3}$.

If the buffer layer 2 is not doped with Al under the concentration condition described above, Zn is diffused from the buffer layer 2 into the channel layer 3 and further into the barrier layer 4. In the above case, since Zn functioning as the acceptor element acts as an electric trap, a current collapse phenomenon occurs in the HEMT element 20.

However, in the HEMT element 20 according to the present embodiment, the occurrence of current collapse is preferably suppressed as a result of preferably suppressing the diffusion of Zn from the free-standing substrate 1 by making the buffer layer 2 of the GaN layer containing Al doped under the concentration condition described above. More specifically, when the concentration of Zn in the channel layer is $1\times10^{16}$ cm$^{-3}$ or less, the occurrence of current collapse is preferably suppressed in the HEMT element 20.

As described above, according to the present embodiment, a semiconductor element capable of suppressing the occurrence of current collapse can be obtained while using the semi-insulating GaN free-standing substrate.

EXAMPLES

Experimental Example 1

After the Zn-doped GaN single crystal free-standing substrate was manufactured, seven types of epitaxial substrates were manufactured, using the free-standing substrate as abase substrate, under the same condition except that the thickness of the buffer layer was varied. Furthermore, the HEMT element was manufactured using each epitaxial substrate. In the following, common Samples No. 1-1 to No. 1-7 are used for the seven types of epitaxial substrates and the HEMT elements manufactured using each of the epitaxial substrates.

(Manufacture of Zn-Doped GaN Single Crystal Substrate by Flux Method)

A GaN low-temperature buffer layer is formed to have a thickness of 30 nm at a temperature of 550° C. on a surface of a c-plane sapphire substrate having a diameter of 2 inches and a thickness of 0.43 mm, and subsequently, a GaN thin film having a thickness of 3 μm is formed by the MOCVD method at a temperature of 1050° C., thereby obtaining a MOCVD-GaN template usable as a seed substrate.

A Zn-doped GaN single crystal layer is formed by the Na flux method using the MOCVD-GaN template which has been obtained as the seed substrate.

Specifically, the MOCVD-GaN template was firstly disposed in an alumina crucible, and subsequently, the alumina crucible was filled with 30 g of metal Ga, 45 g of metal Na, 1 g of metal Zn, and 100 mg of C. The alumina crucible was put in a heating furnace and heated for approximately 100 hours with a furnace temperature of 850° C. and a furnace pressure of 4.5 MPa, and subsequently cooled to room temperature. When the alumina crucible was taken out of the furnace after finishing cooling, a brown GaN single crystal layer was deposited on the surface of the MOCVD-GaN template with a thickness of approximately 1000 μm.

The GaN single crystal layer which had been obtained in such a manner was ground with diamond abrasive grains so that the surface thereof was planarized and the nitride layer formed on a base substrate had a total thickness of 900 μm. The Flux-GaN template having the GaN single crystal layer formed on the MOCVD-GaN template was thereby obtained. When the Flux-GaN template was viewed with the naked eye, no crack was found thereon.

Subsequently, by a laser lift-off method in which laser light was emitted from a side of the seed substrate to perform scanning at a scan speed of 30 mm/sec., the seed substrate was separated from the Flux-GaN template. Third harmonic of Nd: YAG having a wavelength of 355 nm was used as the laser light. A pulse width was set to approximately 30 ns and a pulse period was set to approximately 50 kHz. In emitting the laser light, the laser light was collected to have a circular shape with a diameter of approximately 20 μm, thereby having a light density of approximately 1.0 J/cm. The laser light was emitted while heating the Flux-GaN template from a side opposite to the seed substrate at a temperature of around 50° C.

After separating the seed substrate, a grinding processing was performed on a surface, from which the seed substrate had been detached, of a laminated structure which had been obtained, thereby obtaining a Zn-doped GaN free-standing substrate having a total thickness of 430 μm.

Crystallinity of the Zn-doped GaN substrate which had been obtained was evaluated with an X-ray rocking curve. A half-value width of (0002) plane reflection was 120 seconds and a half-value width of (10-12) plane reflection was 150 seconds, both showing favorable crystalline nature.

(Manufacture of Epitaxial Substrate by MOCVD Method)

Subsequently, an epitaxial substrate was manufactured by the MOCVD method. Specifically, an Al-doped GaN layer as a buffer layer, a GaN layer as a channel layer, and an AlGaN layer as a barrier layer were laminated on each Zn-doped GaN substrate in this order under the following condition. In the following description, a gas ratio of group 15 to group 13 is a ratio (molar ratio) of a supply amount of a group 15 (N) source to a supply amount of group 13 (Ga, Al) sources.

Al-Doped GaN Buffer Layer:
Formation temperature=1050° C.;
Reactor pressure=5 kPa;
Gas ratio of group 15 to group 13=15000;
Gas ratio of Al source gas to group 13 source gas=0.001;
Thickness=0, 10, 20, 100, 200, 1000, or 2000 nm.
GaN Channel Layer:
Formation temperature=1050° C.;
Reactor pressure=100 kPa;
Gas ratio of group 15 to group 13=2000;
Thickness=1000 nm.
AlGaN Barrier Layer:
Formation temperature=1050° C.;
Reactor pressure=5 kPa;
Gas ratio of group 15 to group 13=12000;
Gas ratio of Al source gas to group 13 gas=0.25;
Thickness=25 nm.

The epitaxial substrate including the Al-doped GaN buffer layer with the thickness of 0 nm means the epitaxial substrate including the GaN channel layer formed directly on the Zn-doped GaN substrate without forming the Al-doped GaN buffer layer. The formation condition of the Al-doped GaN buffer layer is based on a premise that the Al concentration in the buffer layer is $5\times10^{19}$ cm$^{-3}$.

After the formation of each layer under the conditions described above in sequence, the susceptor temperature was lowered to around room temperature, and the internal gas of the reactor was returned to atmospheric pressure. Then, the epitaxial substrate which had been manufactured was taken out.

(Manufacture of HEMT Element)

Next, the HEMT element was manufactured using each epitaxial substrate. The HEMT element was designed to have a gate width of 100 μm, a source-gate distance of 1 μm, a gate-drain distance of 4 μm, and a gate length of 1 μm.

Firstly, a portion of a boundary between individual elements was removed by etching to a depth of approximately 100 nm using the photolithography process and the RIE method.

Next, the SiO$_2$ film having a thickness of 100 nm was formed on the epitaxial substrate, and then the SiO$_2$ film at locations where the source electrode and the drain electrode were to be formed was removed by etching using the photolithography process, thereby obtaining an SiO$_2$ pattern layer.

Next, a metal pattern of Ti/Al/Ni/Au (each having a film thickness of 25/200/20/100 nm) was formed at the locations where the source electrode and the drain electrode were to be formed by the vacuum deposition method and the photolithography process, thereby forming the source electrode and the drain electrode. Subsequently, a thermal treatment was performed for 30 seconds in a nitrogen gas atmosphere at a temperature of 825° C. to improve the ohmic contact of the source electrode and the drain electrode.

Then, the SiO$_2$ film at locations where the gate electrode was to be formed was removed from the SiO$_2$ pattern layer using the photolithography process.

Furthermore, a Schottky metal pattern of Ni/Au (each having a film thickness of 20/100 nm) was formed at the locations where the gate electrode was to be formed by the vacuum deposition method and the photolithography process, thereby forming the gate electrode.

The seven types of HEMT elements were obtained by the processes described above. Upon observing these HEMT elements under a differential interference microscope, the occurrence of cracking was confirmed on a surface of the epitaxial substrate (that is to say, a surface of the barrier layer) only in the HEMT element of Sample No. 1-7.

(STEM Evaluation of HEMT Element)

Observation with a scanning transmission electron microscope (STEM) was performed on the HEMT element of Sample No. 1-4, and, based on an observation result thereof, a threading dislocation density of the Zn-doped GaN substrate was calculated to be $2 \times 10^6$ cm$^{-2}$. The dislocation density of the Zn-doped GaN substrate of the other samples which have been manufactured under the same condition is also estimated to be substantially the same as that of Sample No. 1-4.

The threading dislocation density was calculated based on a total number of dislocations confirmed in each field of view in observing the free-standing substrate in a plurality of fields of view.

(SIMS Evaluation of HEMT Element)

An element analysis in a depth direction was performed on the epitaxial substrate of each HEMT element by SIMS (secondary ion mass spectrometry), and a concentration profile of elemental Zn and elemental Al was obtained.

Figure 2:
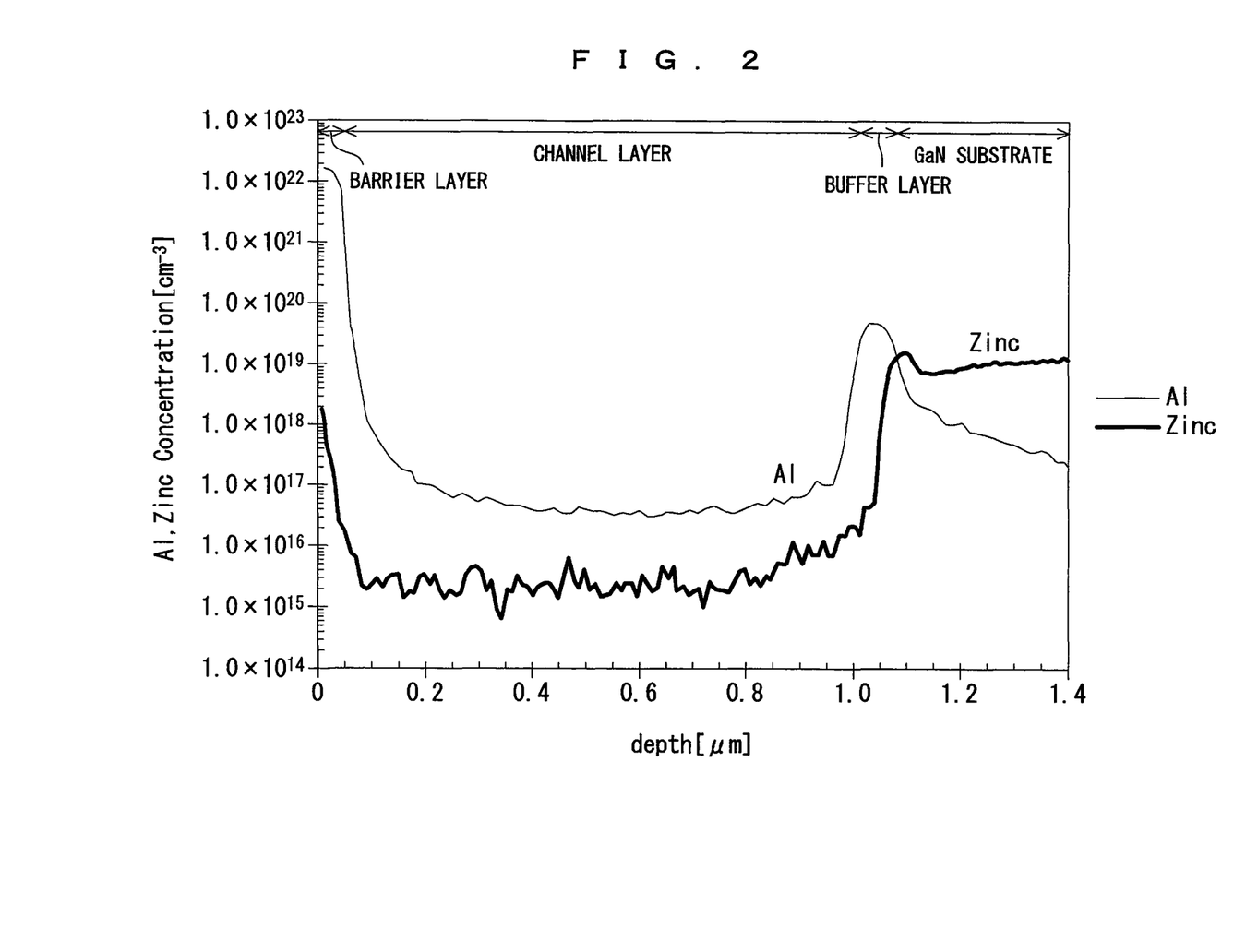
FIG. 2 is a drawing illustrating a concentration profile of elemental Zn and elemental Al in an epitaxial substrate constituting an HEMT element of Sample No. 1-4.
Figure 3:
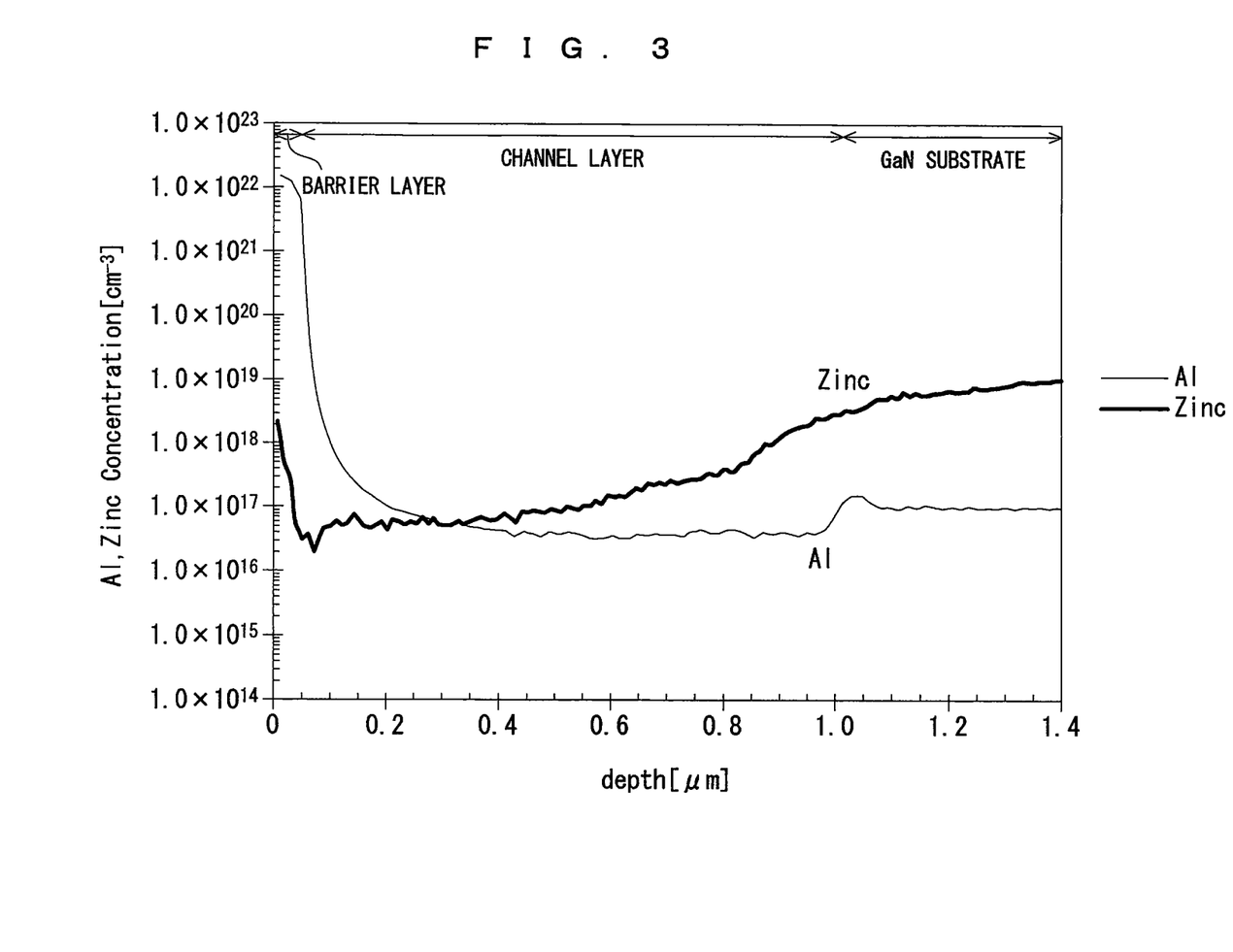
FIG. 3 is a drawing illustrating a concentration profile of elemental Zn and elemental Al in an epitaxial substrate constituting an HEMT element of Sample No. 1-1.

FIG. 2 is a drawing illustrating a concentration profile of the elemental Zn and the elemental Al in the epitaxial substrate constituting the HEMT element of Sample No. 1-4. FIG. 3 is a drawing illustrating a concentration profile of the elemental Zn and the elemental Al in the epitaxial substrate constituting the HEMT element of Sample No. 1-1.

The concentration profile in FIG. 2 shows the following matters.

(1) The GaN substrate is doped with the elemental Zn at a high concentration ($1 \times 10^{19}$ cm$^{-3}$).

(2) The Al concentration of the Al-doped GaN buffer layer is $5 \times 10^{19}$ cm$^{-3}$.

(3) The concentration of the elemental Zn, which is high in a portion from the interface between the buffer layer and the GaN substrate toward a side of the substrate, rapidly decreases in the buffer layer, furthermore, also gradually decreases in the channel layer, and reaches to $5 \times 10^{15}$ cm$^{-3}$ which is a lower detection limit value (background level) of Zn in the SIMS measurement.

The matters of these (1) to (3) were also found in the HEMT elements of Samples No. 1-2 to No. 1-6 as well except that the lower limit of the concentration value of the elemental Zn in the channel layer in the HEMT element of Sample No. 1-2 was $8 \times 10^{15}$ cm$^{-3}$. This means that in the HEMT element of Samples No. 1-2 to No. 1-6, the diffusion of the elemental Zn, with which the GaN substrate has been doped, into the channel layer is suppressed.

In contrast, the concentration profile in FIG. 3 shows the following matters.

(4) The GaN substrate is doped with the elemental Zn at a high concentration ($1 \times 10^{19}$ cm$^{-3}$).

(5) The concentration of the elemental Zn gradually decreases in the channel layer, however, a degree of reduction thereof is small compared with that in the HEMT element of Sample No. 1-4, and, even in the neighborhood of the barrier layer, the concentration of the elemental Zn is equal to or higher than $8 \times 10^{16}$ cm$^{-3}$, that is higher than that of the HEMT element of Sample No. 1-4 by one order of magnitude.

The matters of these (4) and (5) mean that in the HEMT element of Sample No. 1-1, the elemental Zn with which the GaN substrate has been doped is diffused into the channel layer.

The result described above means that the diffusion of Zn from the substrate into the channel layer is suppressed by providing the Al-doped GaN buffer layer between the Zn-doped GaN substrate and the channel layer, that is to say, the Al-doped GaN buffer layer functions as the diffusion suppressing layer.

(Electrical Characteristics Evaluation of HEMT Element)

Drain current-drain voltage characteristics (Id-Vd characteristics) of the HEMT elements of Samples No. 1-1 to No. 1-6 were evaluated in a DC mode and a pulse mode (static drain bias Vdq=30V, static gate bias Vgq=−5V) using a semiconductor parameter analyzer. A pinch-off threshold voltage was Vg=−3V.

Adopted as an index for evaluating the current collapse was a ratio R of the drain current Id$_{pulse}$ in the pulse mode to the drain current Id$_{DC}$ in the DC mode in a case of applying the drain voltage Vd=5V and the gate voltage Vg=2V (=Id$_{pulse}$/Id$_{DC}$, 0≤R≤1), and the ratio R was obtained for each HEMT element. When the value R is equal to or larger than 0.7, it can be determined that the current collapse is small in the HEMT element.

Table 1 shows, in a list, the Al concentration of the buffer layer and the Zn concentration of the channel layer obtained from the concentration profile and the value R together with the thickness of the buffer layer and presence/absence of the cracking on the surface of the epitaxial substrate (referred to as "film crack" in Table 1) for each sample of the experimental example 1. Applied were the values of the Al concentration and the Zn concentration at a central portion of the targeted layer in the thickness direction (the same applies to subsequent experimental examples). Table 1 also indicates which each sample falls under, the Example or a Comparative Example.

TABLE 1

|  | Sample No. | Thickness of buffer layer (nm) | Al concentration of buffer layer ($cm^{-3}$) | Zn concentration of channel layer ($cm^{-3}$) | Film crack | Value R | Example/ Comparative Example |
|---|---|---|---|---|---|---|---|
| Experimental Example 1 | 1-1 | 0 | — | $8.0 \times 10^{16}$ | Absent | 0.25 | Comparative Example |
|  | 1-2 | 10 | $5.0 \times 10^{19}$ | $8.0 \times 10^{15}$ | Absent | 0.71 | Example |
|  | 1-3 | 20 | $5.0 \times 10^{19}$ | $5.0 \times 10^{15}$(B.G.L) | Absent | 0.80 | Example |
|  | 1-4 | 100 | $5.0 \times 10^{19}$ | $5.0 \times 10^{15}$(B.G.L) | Absent | 0.90 | Example |
|  | 1-5 | 200 | $5.0 \times 10^{19}$ | $5.0 \times 10^{15}$(B.G.L) | Absent | 0.92 | Example |
|  | 1-6 | 1000 | $5.0 \times 10^{19}$ | $5.0 \times 10^{15}$(B.G.L) | Absent | 0.77 | Example |
|  | 1-7 | 2000 | $5.0 \times 10^{19}$ | — | Present | — | Comparative Example |

As indicated by Table 1, in the HEMT element of Sample No. 1-1 which does not have the buffer layer has the Zn concentration of the channel layer of $8 \times 10^{16}$ $cm^{-3}$, which is higher than $1 \times 10^{16}$ $cm^{-3}$, and the value R is only 0.25.

In contrast, in the HEMT elements of Samples No. 1-2 to 1-6, each having a buffer layer with the thickness of 10 to 1000 nm, the Zn concentration of the channel layer is equal to or lower than $1 \times 10^{16}$ $cm^{-3}$, and the value R is equal to or larger than 0.70. That is to say, it is deemed that the current collapse is small in the HEMT elements of Samples No. 1-2 to 1-6.

Particularly, in the HEMT elements of Samples No. 1-3 to No. 1-5, each having the buffer layer with the thickness of 20 to 200 nm, the Zn concentration of the channel layer decreases to approximately $5 \times 10^{15}$ $cm^{-3}$, which is a lower detection limit value in the SIMS, and the value R is equal to or larger than 0.80. B.G.L in Table 1 means that the Zn concentration is at a background level (the same applies to Table 2 and Table 3). That is to say, it is deemed that the current collapse is particularly small in the HEMT elements of Samples No. 1-3 to No. 1-5.

Experimental Example 2

After the Zn-doped GaN single crystal free-standing substrate was manufactured under the conditions of manufacture and the procedures similar to those in the Experimental Example 1, seven types of epitaxial substrates were manufactured using the free-standing substrate as a base substrate. The conditions of manufacture in the above case were the same as that in the Experimental Example 1 except that the gas ratio of the Al source gas to the group 13 source gas in the formation of the Al-doped GaN buffer layer was varied to vary the Al concentration. More specifically, the gas ratio of the Al source gas to the group 13 source gas in the formation of the buffer layer was varied at seven levels of 0.00001, 0.00002, 0.0001, 0.001, 0.02, 0.1, and 0.2. The thickness of the buffer layer was set to 100 nm.

Since the conditions of manufacture of the Zn-doped GaN substrate are the same as that in the Experimental Example 1, the dislocation density thereof is estimated to be substantially the same as Sample No. 1-4.

Furthermore, the HEMT element was manufactured using each epitaxial substrate. In the following, common Samples No. 2-1 to No. 2-7 are used for the seven types of epitaxial substrates and the HEMT elements manufactured using each of the epitaxial substrates. The epitaxial substrate and the HEMT element of Sample No. 2-4 are the same as the epitaxial substrate and the HEMT element of Sample No. 1-4 in the Experimental Example 1, respectively.

Performed on the seven types of HEMT elements which had been obtained were the observations under the differential interference microscope, the element analysis in the depth direction by SIMS, the calculation of the Al concentration of the buffer layer and the Zn concentration of the channel layer based on the concentration profile which had been obtained thereby, and the calculation of the value R based on the evaluation result of the Id-Vd characteristics using the semiconductor parameter analyzer, in the manner similar to the Experimental Example 1. However, the calculation of the Zn concentration, the evaluation of the Id-Vd characteristics, and the calculation of the value R were not performed on the HEMT element of Sample No. 2-7 in which the occurrence of crack had been confirmed on the surface of the epitaxial substrate (that is to say, the surface of the barrier layer) as a result of the observation under the differential interference microscope.

Table 2 shows, in a list, the Al concentration of the buffer layer, the Zn concentration of the channel layer, and the value R together with the thickness of the buffer layer and presence/absence of the cracking on the surface of the epitaxial substrate for each sample of the Experimental Example 2. Table 2 also indicates which each sample falls under, the Example or a Comparative Example.

TABLE 2

|  | Sample No. | Thickness of buffer layer (nm) | Al concentration of buffer layer ($cm^{-3}$) | Zn concentration of channel layer ($cm^{-3}$) | Film crack | Value R | Example/ Comparative Example |
|---|---|---|---|---|---|---|---|
| Experimental Example 2 | 2-1 | 100 | $5.0 \times 10^{17}$ | $7.0 \times 10^{16}$ | Absent | 0.40 | Comparative Example |
|  | 2-2 | 100 | $1.0 \times 10^{18}$ | $1.0 \times 10^{16}$ | Absent | 0.70 | Example |
|  | 2-3 | 100 | $5.0 \times 10^{18}$ | $5.0 \times 10^{15}$(B.G.L) | Absent | 0.85 | Example |
|  | 2-4(=1-4) | 100 | $5.0 \times 10^{18}$ | $5.0 \times 10^{15}$(B.G.L) | Absent | 0.90 | Example |
|  | 2-5 | 100 | $1.0 \times 10^{19}$ | $5.0 \times 10^{15}$(B.G.L) | Absent | 0.91 | Example |
|  | 2-6 | 100 | $5.0 \times 10^{21}$ | $9.0 \times 10^{15}$ | Absent | 0.75 | Example |

TABLE 2-continued

| Sample No. | Thickness of buffer layer (nm) | Al concentration of buffer layer (cm$^{-3}$) | Zn concentration of channel layer (cm$^{-3}$) | Film crack | Value R | Example/ Comparative Example |
|---|---|---|---|---|---|---|
| 2-7 | 100 | 1.0 × 10$^{22}$ | — | Present | — | Comparative Example |

As indicated by Table 2, in the HEMT element of Sample No. 2-1 in which the Al concentration in the buffer layer is 5.0×10$^{17}$ cm$^{-3}$, the Zn concentration of the channel layer is 7×10$^{16}$ cm$^{-3}$, which is higher than 1×10$^{16}$ cm$^{-3}$, and the value R is only 0.40.

In contrast, in the HEMT elements of Samples No. 2-2 to No. 2-6 in which the Al concentration in the buffer layer is 1.0×10$^{18}$ cm$^{-3}$ to 5.0×10$^{21}$ cm$^{-3}$, the Zn concentration of the channel layer is equal to or lower than 1×10$^{16}$=$^{-3}$, and the value R is equal to or larger than 0.70. That is to say, it is deemed that the current collapse is small in the HEMT elements of Samples No. 2-2 to No. 2-6.

Particularly, in the HEMT elements of Samples No. 2-3 to No. 2-5 in which the Al concentration in the buffer layer is 5.0×10$^{18}$ cm$^{-3}$ to 1.0×10$^{21}$ cm$^{-3}$, the Zn concentration of the channel layer decreases to approximately 5×10$^{15}$ cm$^{-3}$, which is a lower detection limit value in the SIMS, and the value R is equal to or larger than 0.85. That is to say, it is deemed that the current collapse is particularly small in the HEMT elements of Samples No. 2-3 to No. 2-5.

Experimental Example 3

After the Zn-doped GaN single crystal free-standing substrate was manufactured by the procedures similar to those in the Experimental Example 1, three types of epitaxial substrates were manufactured using the free-standing substrate as abase substrate, and the HEMT elements were manufactured using each epitaxial substrate.

However, in manufacturing each Zn-doped GaN single crystal free-standing substrate, the growth time was varied in forming the GaN single crystal layer by the flux method so that the thickness of the GaN single crystal layer formed on the surface of the MOCVD-GaN template was varied. This was intended to obtain the Zn-doped GaN single crystal free-standing substrates having the different dislocation densities. More specifically, the thickness of the GaN single crystal layer was varied at three levels of 1000 μm, 600 μm, and 200 μm by varying a heat-holding time of keeping a heating temperature at 850° C. to three levels of 100 hours, 70 hours, and 40 hours.

The conditions of manufacture of the epitaxial substrate and the HEMT element were the same as those in the case of manufacturing the epitaxial substrate according to Sample No. 1-4. For example, in forming the Al-doped GaN buffer layer, the gas ratio of the Al source gas to the group 13 source gas was set to 0.001 so that the Al concentration was 5.0×10$^{19}$ cm$^{-3}$, and the thickness of the buffer layer was set to 100 nm.

In the following, common Samples No. 3-1 to No. 3-3 are used for the three types of epitaxial substrates and the HEMT elements manufactured using each of the epitaxial substrates. However, the epitaxial substrate and the HEMT element of Sample No. 3-1 are the same as the epitaxial substrate and the HEMT element of Sample No. 1-4 in the Experimental Example 1, respectively.

Performed on the three types of HEMT elements which had been obtained were the observations under the differential interference microscope, the evaluation of the threading dislocation density of the Zn-doped GaN substrate based on the STEM observation result, the element analysis in the depth direction by SIMS, the calculation of the Al concentration of the buffer layer and the Zn concentration of the channel layer based on the concentration profile which had been obtained thereby, and the calculation of the value R based on the evaluation result of the Id-Vd characteristics using the semiconductor parameter analyzer, in the manner similar to the Experimental Example 1.

Table 3 shows, in a list, the dislocation density of the Zn-doped GaN single crystal free-standing substrate (described as "the GaN substrate" in Table 3), the Zn concentration of the channel layer, and the value R together with presence/absence of the cracking on the surface of the epitaxial substrate for each sample of the Experimental Example 3. Table 3 also indicates which each sample falls under, the Example or a Comparative Example.

TABLE 3

| | Sample No. | Dislocation density of GaN substrate (cm$^{-2}$) | Zn concentration of channel layer (cm$^{-3}$) | Film crack | Value R | Example/ Comparative Example |
|---|---|---|---|---|---|---|
| Experimental Example 3 | 3-1(=1-4) | 2.0 × 10$^{16}$ | 5.0 × 10$^{15}$(B.G.L) | Absent | 0.90 | Example |
| | 3-2 | 5.0 × 10$^{7}$ | 1.0 × 10$^{16}$ | Absent | 0.70 | Example |
| | 3-3 | 1.0 × 10$^{8}$ | 9.0 × 10$^{16}$ | Absent | 0.22 | Comparative Example |

As indicated by Table 3, in the HEMT element of Sample No. 3-3 in which the dislocation density of the Zn-doped GaN single crystal free-standing substrate is 1.0×10$^{8}$ cm$^{-2}$, the Zn concentration of the channel layer is 9×10$^{16}$ cm$^{-3}$, which is higher than 1×10$^{16}$ cm$^{-3}$, and the value R is only 0.22.

In contrast, in the HEMT elements of Samples No. 3-1 and No. 3-2 in which the dislocation density of the Zn-doped GaN single crystal free-standing substrate is equal to or lower than 5.0×10$^{7}$ cm$^{-2}$, the Zn concentration of the channel layer is equal to or lower than 1×10$^{16}$ cm$^{-3}$, and the value R is equal to or larger than 0.70. That is to say, it is deemed that the current collapse is small in the HEMT elements of Samples No. 3-1 and No. 3-2.

Particularly, in the HEMT element of Sample No. 3-1 in which the dislocation density of the Zn-doped GaN single crystal free-standing substrate is $2.0\times10^6$ cm$^{-2}$, the Zn concentration of the channel layer decreases to approximately $5\times10^{15}$ cm$^{-3}$, which is the lower detection limit value in the SIMS, and the value R is 0.90. That is to say, it is deemed that the current collapse is particularly small in the HEMT element of Sample No. 3-1.

Conclusion of Experimental Examples 1 to 3

The following is confirmed by the results of the Experimental Examples 1 to 3 described above.

In the case where the HEMT element is manufactured by laminating the channel layer and the barrier layer on the Zn-doped GaN single crystal free-standing substrate which is doped with the elemental Zn at the high concentration equal to or higher than $1\times10^{18}$ cm$^{-3}$, the free-standing substrate is prepared to have the dislocation density equal to or lower than $5.0\times10^7$ cm$^{-2}$, the Al-doped GaN buffer layer having the Al concentration of $1\times10^{18}$ cm$^{-3}$ to $5\times10^{21}$ cm$^{-3}$ is formed to have the thickness of 10 to 1000 nm on the free-standing substrate, and then, the channel layer is formed thereon, thus the diffusion of Zn from the free-standing substrate into the channel layer can be preferably suppressed.

Specifically, the Zn concentration in the channel layer can be reduced to $1\times10^{16}$ cm$^{-3}$ or less. In the HEMT element in which the diffusion of Zn is preferably suppressed, the occurrence of the current collapse is preferably suppressed.

Particularly, when the thickness of the buffer layer ranges from 20 to 200 nm, or when the Al concentration of the buffer layer ranges from $5\times10^{18}$ cm$^{-3}$ to $1\times10^{21}$ cm$^{-3}$, the occurrence of the current collapse is further suppressed.

What is claimed is:

1. An epitaxial substrate for semiconductor elements, comprising:
   a semi-insulating free-standing substrate whose dislocation density is equal to or lower than $5.0\times10^7$ cm$^{-2}$, formed of GaN doped with Zn;
   a buffer layer adjacent to said free-standing substrate and having a thickness of 20 nm to 200 nm and Al concentration of $5\times10^{16}$ cm$^{-3}$ to $1\times10^{21}$ cm$^{-3}$;
   a channel layer adjacent to said buffer layer and having a concentration of Zn equal to or lower than $1\times10^{16}$ cm$^{-3}$; and
   a barrier layer provided on an opposite side of said buffer layer with said channel layer provided therebetween, wherein
   said buffer layer is a diffusion suppressing layer formed of Al-doped GaN and suppresses the diffusion of Zn from said free-standing substrate into said channel layer.

2. The epitaxial substrate for the semiconductor elements according to claim 1, wherein
   said channel layer is formed of GaN, and said barrier layer is formed of AlGaN.

3. A semiconductor element, comprising:
   a semi-insulating free-standing substrate whose dislocation density is equal to or lower than $5.0\times10^7$ cm$^{-2}$, formed of GaN doped with Zn;
   a buffer layer adjacent to said free-standing substrate and having a thickness of 20 nm to 200 nm and Al concentration of $5\times10^{16}$ cm$^{-3}$ to $1\times10^{21}$ cm$^{-3}$;
   a channel layer adjacent to said buffer layer and having a concentration of Zn equal to or lower than $1\times10^{16}$ cm$^{-3}$;
   a barrier layer provided on an opposite side of said buffer layer with said channel layer provided therebetween; and
   a gate electrode, a source electrode, and a drain electrode provided on said barrier layer, wherein
   said buffer layer is a diffusion suppressing layer formed of Al-doped GaN and suppresses the diffusion of Zn from said free-standing substrate into said channel layer.

4. The semiconductor element according to claim 3, wherein
   said channel layer is formed of GaN, and said barrier layer is formed of AlGaN.

5. A method of manufacturing an epitaxial substrate for semiconductor elements, comprising:
   a) a preparation step of preparing a semi-insulating free-standing substrate having a dislocation density equal to or lower than $5.0\times10^7$ cm$^{-2}$ and formed of GaN doped with Zn;
   b) a buffer layer formation step of forming a buffer layer adjacent to said free-standing substrate;
   c) a channel layer formation step of forming a channel layer adjacent to said buffer layer; and
   d) a barrier layer formation step of forming a barrier layer in a position opposite to said buffer layer with said channel layer provided therebetween, wherein
   in said buffer layer formation step, said buffer layer is formed as a diffusion suppressing layer formed of Al-doped GaN, which has a thickness of 20 nm to 200 nm and Al concentration of $5\times10^{18}$ cm$^{-3}$ to $1\times10^{21}$ cm$^{-3}$, and suppresses the diffusion of Zn from said free-standing substrate into said channel layer, so that a concentration of Zn in said channel layer is equal to or lower than $1\times10^{16}$ cm$^{-3}$.

6. The method of manufacturing the epitaxial substrate for the semiconductor elements according to claim 5, wherein
   said channel layer is formed of GaN, and said barrier layer is formed of AlGaN.

7. The method of manufacturing the epitaxial substrate for the semiconductor elements according to claim 5, wherein
   said free-standing substrate is manufactured by a flux method.

8. The method of manufacturing the epitaxial substrate for the semiconductor elements according to claim 6, wherein
   said free-standing substrate is manufactured by a flux method.

* * * * *